United States Patent
Miyano et al.

(10) Patent No.: US 7,267,848 B2
(45) Date of Patent: *Sep. 11, 2007

(54) METHOD OF FABRICATING A PROTECTIVE FILM BY USE OF VACUUM ULTRAVIOLET RAYS

(75) Inventors: Junichi Miyano, Miyazaki (JP); Kiyohiko Toshikawa, Miyazaki (JP); Yoshikazu Motoyama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 212 days.

This patent is subject to a terminal disclaimer.

(21) Appl. No.: 10/676,258

(22) Filed: Oct. 2, 2003

(65) Prior Publication Data

US 2004/0131796 A1 Jul. 8, 2004

(30) Foreign Application Priority Data

Oct. 2, 2002 (JP) .............................. 2002-289860

(51) Int. Cl.
*C23C 14/28* (2006.01)
(52) U.S. Cl. ..................................... 427/595; 427/596
(58) Field of Classification Search ................ 427/595, 427/582, 586, 596
See application file for complete search history.

(56) References Cited

U.S. PATENT DOCUMENTS

| | | | | |
|---|---|---|---|---|
| 4,382,100 A | * | 5/1983 | Holland ....................... | 427/577 |
| 4,749,631 A | * | 6/1988 | Haluska et al. ............. | 428/704 |
| 5,028,560 A | * | 7/1991 | Tsukamoto et al. ......... | 438/482 |
| 5,061,509 A | * | 10/1991 | Naito et al. .................. | 427/497 |
| 5,393,565 A | * | 2/1995 | Suzuki et al. .......... | 427/255.391 |
| 5,529,951 A | * | 6/1996 | Noguchi et al. ............ | 438/487 |
| 5,728,724 A | * | 3/1998 | Bryant et al. ................ | 514/443 |
| 5,803,975 A | * | 9/1998 | Suzuki ............... | 118/723 MW |
| 5,914,151 A | * | 6/1999 | Usuki .......................... | 427/128 |
| 5,932,281 A | * | 8/1999 | Hochido et al. .......... | 427/126.3 |
| 6,015,759 A | * | 1/2000 | Khan et al. .................. | 438/707 |
| 6,121,727 A | * | 9/2000 | Kanai et al. ................. | 313/504 |

(Continued)

FOREIGN PATENT DOCUMENTS

JP          11-214670          8/1999

(Continued)

OTHER PUBLICATIONS

Arkles, Barry C., "Silicon Nitride from Organosilazane Cyclic and Linear Prepolymers." J. Electrochem. Soc., vol. 133, No. 1, pp. 233-234 (Jan. 1986).*

*Primary Examiner*—Bret Chen
(74) *Attorney, Agent, or Firm*—Rabin & Berdo, PC (57) ABSTRACT

In a method of fabricating a protective film, a vacuum ultraviolet radiation CVD (Chemical Vapor Deposition) system is used. The method includes providing a vacuum ultraviolet rays generator, a reactor provided with a platform for supporting a substrate, a heat retainer provided on the platform, and a window separating the vacuum ultraviolet rays generator from the reactor. Then, a step of feeding an organic stock gas from a gas feeder into the reactor while retaining the temperature of the substrate at a temperature of about equal to or less than 100° C. with the heat retainer is performed. Simultaneously, a step of irradiating the reactor with vacuum ultraviolet rays from the vacuum ultraviolet rays generator through the window is performed.

4 Claims, 4 Drawing Sheets

U.S. PATENT DOCUMENTS

| | | | |
|---|---|---|---|
| 6,130,118 A * | 10/2000 | Yamazaki | 438/151 |
| 6,274,206 B1 * | 8/2001 | Turchan et al. | 427/553 |
| 6,284,050 B1 * | 9/2001 | Shi et al. | 118/715 |
| 6,296,933 B1 * | 10/2001 | Goda et al. | 428/364 |
| 6,586,056 B2 * | 7/2003 | Arkles et al. | 427/582 |
| 6,624,094 B2 * | 9/2003 | Toshikawa et al. | 438/788 |
| 6,627,560 B1 * | 9/2003 | Miyano et al. | 438/788 |
| 6,656,854 B2 * | 12/2003 | Miyano et al. | 438/778 |
| 6,790,788 B2 * | 9/2004 | Li et al. | 438/778 |
| 2002/0059810 A1 * | 5/2002 | Borrelli et al. | 65/17.2 |

FOREIGN PATENT DOCUMENTS

| | | |
|---|---|---|
| JP | 2001-156057 | 6/2001 |
| JP | 2001-210638 | 8/2001 |

* cited by examiner

METHOD OF FABRICATING A PROTECTIVE FILM BY USE OF VACUUM ULTRAVIOLET RAYS

BACKGROUND OF THE INVENTION

The invention relates to a method of fabricating a protective film having moisture-proof performance.

In the fabrication of a semiconductor integrated circuit, an insulating film made from $SiO_2$ etc., and a protective film made of a nitride film made from $Si_3N_4$ etc. are generally formed by the plasma CVD (Chemical Vapor Deposition) method (refer to patent document, for example, JP, H 11-214670, A) or a thermal CVD method such as the LP (Low Pressure) CVD method, and so forth. For example, the nitride film made from $Si_3N_4$ is formed by the LP CVD method carried out at a high reaction temperature in the range of 800 to 900° C. by use of dichlorosailane gas and ammonia gas as stock gases. Incidentally, the following U.S. applications for Letters patent relating to a method of fabricating an insulating film by use of vacuum ultraviolet rays, which are commonly assigned with this application, have been submitted to U.S. PTO by the assignee of the inventor of this application: Ser. Nos. 09/798,930, 09/833,646, 10/052,243, 10/059,174, and 10/105,382.

If the insulating film and protective film are formed by the plasma CVD method or by the thermal CVD method, this will cause damage to the semiconductor integrated circuit. Such damage is damage sustained by a semiconductor device, caused by expansion of diffusion layers, occurring at a high reaction temperature at the time of carrying out the thermal CVD method, or by the agency of charged particles in plasma at the time of carrying out the plasma CVD method.

As a result of further progress made in miniaturization of the semiconductor integrated circuit, for example, MOS-FETs (Metal Oxide Semiconductor Field Effect Transistors) formed in the semiconductor integrated circuit undergo a change in construction such that a gate length becomes shorter, and the diffusion layers, such as a channel, etc., become narrower in width as well as shallower in depth. Accordingly, in the case of a miniaturized semiconductor integrated circuit, the above-described damage becomes an increasingly serious problem that must be resolved.

SUMMARY OF THE INVENTION

It is therefore an object of the invention to provide a method of fabricating a protective film at a low temperature without causing damage due to a plasma CVD to a semiconductor device.

With the invention, a protective film is fabricated in a vacuum ultraviolet radiation CVD system comprising a vacuum ultraviolet rays generator, a reactor provided with a platform for supporting a substrate, and a window separating the vacuum ultraviolet rays generator from the reactor. In fabricating the protective film, an organic stock gas is fed from a gas feeder into the reactor of the vacuum ultraviolet radiation CVD system while retaining temperature of the substrate at a low temperature with a heat retainer provided on the platform and simultaneously, the reactor is irradiated with vacuum ultraviolet rays from the vacuum ultraviolet rays generator through the window.

BRIEF DESCRIPTION OF THE DRAWINGS

FIG. 2 (A) is a view showing results of measuring a first sample with a metallurgical microscope prior to a PCT;

FIG. 2 (B) is a view showing results of measuring the first sample with the metallurgical microscope after the PCT;

FIG. 3 (A) is a view showing results of measuring a second sample with a metallurgical microscope prior to a PCT;

FIG. 3 (B) is a view showing results of measuring the second sample with the metallurgical microscope after the PCT.

DETAILED DESCRIPTION OF THE PREFERRED EMBODIMENTS

Embodiments of the invention are described hereinafter with reference to the accompanying drawings. It is to be understood, however, that respective figures used in describing the invention are merely for broadly describing the invention, and the scope of the invention is not to be limited to only the embodiments as illustrated in those figures.

Figure 1:
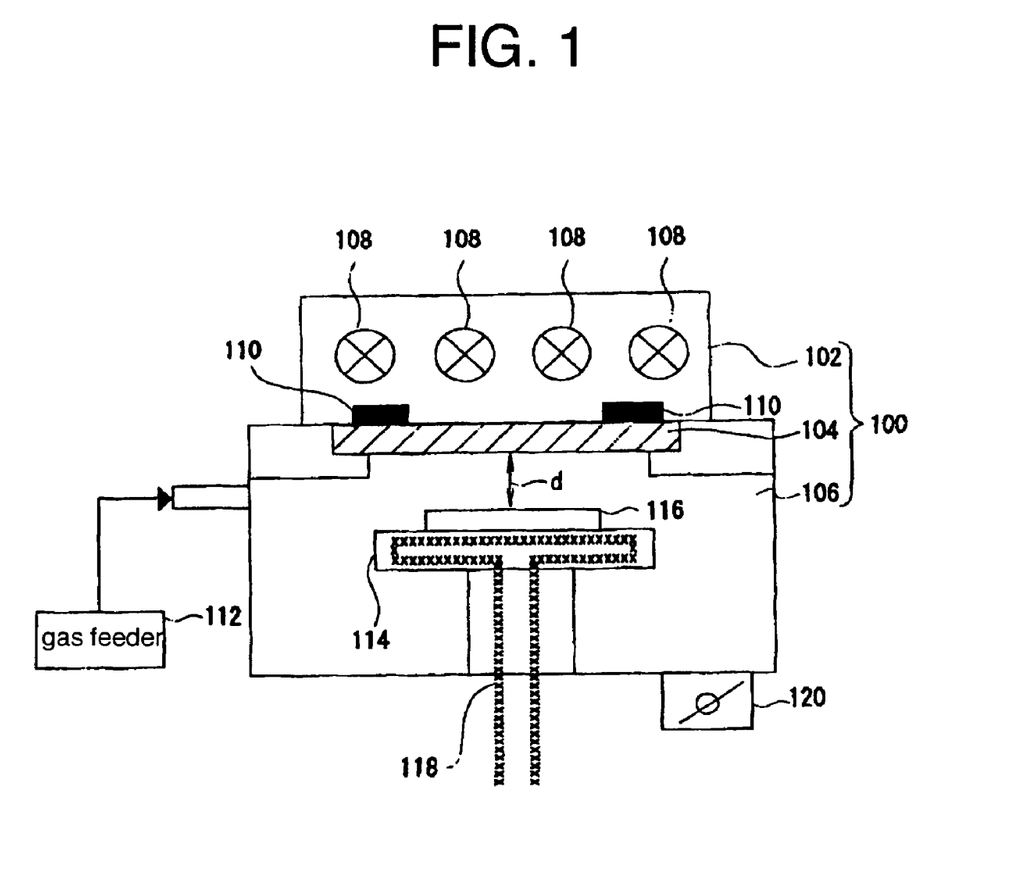
FIG. 1 is a sectional view showing an example of the construction of a vacuum ultraviolet radiation CVD system used in carrying out embodiments of the invention.

A first embodiment of a method of fabricating a protective film according to the invention is described hereinafter with reference to FIG. 1. FIG. 1 is a sectional view showing an example of the construction of a vacuum ultraviolet radiation CVD system 100 used in carrying out the first embodiment of the invention.

The vacuum ultraviolet radiation CVD system 100 shown in FIG. 1 comprises a vacuum ultraviolet rays generator 102, a reactor 106, and a window 104 separating the vacuum ultraviolet rays generator 102 from the reactor 106.

Inside the reactor 106, there is installed a platform 114 for supporting a substrate 116. A gas feeder 112 for feeding a stock gas to the reactor 106 is installed either inside of, or outside of the reactor 106. The platform 114 is provided with a heat retainer 118 for keeping the substrate 116 at a given temperature during reaction inside the reactor 106 as described later. Feeding of the stock gas from the gas feeder 112, and specific construction and operation of the heat retainer 118 will be described in detail by way of example later.

Further, the vacuum ultraviolet rays generator 102 is provided with a plurality of excimer lamps 108. A light emitting gas for use by the excimer lamps 108 is preferably selected depending on the kind of the stock gas that is fed to the reactor 106. A plurality of element bonds exist in a compound that the stock gas is made from, and the energy of the respective bonds varies depending on the kind of the stock gas. Accordingly, the light emitting gas is preferably selected such that the energy of respective photons of light radiated by the excimer lamps 108 is equivalent to, or greater than the energy of each of the plurality of the element bonds of the compound.

The window 104 is made up so as to allow light rays at a main wavelength among vacuum ultraviolet rays from the vacuum ultraviolet rays generator 102 to pass therethrough. And the window 104 is provided with heaters 110, so that the heaters 110 retain heat so as to keep the window 104 at a given temperature during the reaction inside the reactor 106 as described later. If heat is retained at the window 104 in this way, a reaction rate of the reaction inside the reactor 106, which will be described later, considerably decreases in close proximity of the window 104. That is, heat retaining at the window 104 causes reaction in close proximity of the window 104, inside the reactor 106, as described later, to become less prone to occur, so that it is possible to prevent clouding of the window 104 due to a film, formed as a result of such reaction, being deposited on the window 104.

With the example of the construction, shown in FIG. 1, there are installed the heaters 110 in ring-like shape on the top surface of the window 104, on the side of the vacuum ultraviolet rays generator 102, namely, on the surface of the window 104, outside of the reactor 106. However, the installation manner or the shape of the heaters 110, adopted in the first embodiment, are not to be limited to those shown in the example of the construction, shown in FIG. 1.

There is now described an example of the method of fabricating the protective film according to the first embodiment, applied to the substrate 116 in the vacuum ultraviolet radiation CVD system 100 of the construction described above.

The substrate 116 has an aluminum (Al) wiring pattern, and on top of the wiring pattern, a BPSG film that is an oxide film (silicate glass film) doped with boron and phosphorus is formed to a thickness 5000 Å.

In the case of a protective film being made of a film containing Si (silicon) and N (nitrogen), the protective film generally has moisture-proof performance. With the first embodiment, for a stock gas to be fed into the vacuum ultraviolet radiation CVD system 100 to form the protective film described, use is made of an organosilazane gas that is an organic stock gas having Si—N bonds. Particularly, in this case, for the stock gas, use is made of bis (tert-butylamino) silane (hereinafter referred to as BTBAS), which is an organosilazane gas, (a product with the same trade name, manufactured by Daido Air Products Electronics Co., Ltd.).

Further, for an organosilazane gas other than the above, use is preferably made of a compound selected from the group consisting of tetramethyldisilazane ($Si_2C_4H_{15}N$), hexamethylcyclotrisilazane ($Si_3C_6H_{21}N_3$), heptamethyldisilazane ($C_7H_{21}NSi_2$), and tris (dimethylamino) silane ($C_6H_{19}N_2Si$).

BTBAS is fed through the gas feeder 112 into the reactor 106 evacuated to a substantially vacuum state beforehand. In this case, BTBAS vapor of a vapor pressure 70 mTorr at 25?C is fed from the gas feeder 112. There may be a case where BTBAS vaporized with, for example, a vaporizer is fed into the reactor 106 from the gas feeder 112.

With the present embodiment, when forming the protective film in the vacuum ultraviolet radiation CVD system 100, vacuum ultraviolet rays are radiated from the vacuum ultraviolet rays generator 102 to the reactor 106 through the window 104 while BTBAS is being fed into the reactor 106.

In this case, the excimer lamps 108 inside the vacuum ultraviolet rays generator 102 are made up of xenon (Xe) excimer lamps using xenon (Xe) for a light emitting gas. Theoretical values of energies of a plurality of element bonds existing in BTBAS as the stock gas are 5.0 eV for a Si—N bond, 4.3 eV for a C—H bond, 3.6 eV for a C—C bond, 3.0 eV for a Si—H bond, 4.0 eV for a N—H bond, and 3.7 eV for a C—N bond, respectively. In contrast, the vacuum ultraviolet rays radiated from the vacuum ultraviolet rays generator 102 comprising the xenon (Xe) excimer lamps 108 have the main wavelength of 172 nm, and photon energy of 7.2 eV. Further, a synthetic quartz window 20 mm in thickness is used for the window 104, allowing the vacuum ultraviolet rays with the main wavelength of 172 nm to pass therethrough. In addition, the temperature of the window 104 is kept at 90?C with the heaters 110 installed as previously described.

Hence, it is presumed that upon irradiation of the reactor 106 through the window 104 with the vacuum ultraviolet rays at the main wavelength of 172 nm, having the photon energy of 7.2 eV, radiated from the vacuum ultraviolet rays generator 102, BTBAS fed into the reactor 106 undergoes decomposition. Upon the decomposition of BTBAS, chemically active excited activated species are generated, thereby inducing a vapor phase reaction. In the vapor phase reaction, the Si—N bonds of BTBAS are presumed to be severed due to the decomposition of BTBAS. As a result, a protective film containing Si (silicon) and N (nitrogen) is formed on the substrate 116. That is, the reaction proceeding in the reactor 106 will become a reaction for forming the protective film containing Si (silicon) and N (nitrogen) due to the decomposition of BTBAS having the Si—N bonds.

For the xenon excimer lamps 108, use is made of a high power lamp with irradiance, immediately underneath the window 104, at 40 mW/cm$^2$, in order to increase a forming rate of the protective film. Measurement of irradiance is performed with an illuminometer (trade name: UIT-150/VUVS-172, manufactured by Ushio Electric Appliance Co., Ltd.). Further, a distance d between a surface of the window 104, on the side of the reactor 106, and the top surface of the substrate 116 is set to 25 mm. Those values are adjusted as above because of deterioration in decomposition efficiency of BTBAS if irradiance decreases or the distance d between the window 104 and the substrate 116 increases.

Further, as shown in FIG. 1, the heat retainer 118 serves as a tiller as well, with a construction enabling antifreeze to be circulated inside the platform 114. With the tiller 118 of such a construction being installed inside the platform 114, the platform 114 can be kept at a given temperature, thereby keeping the substrate 116 as well at a given temperature. In the case of the first embodiment, the temperature of the substrate 116 is maintained at room temperature (25?C). With the first embodiment, the heat retainer 118 is not limited in construction to the case of the same being constructed with the tiller adopted, but can be constructed by predetermined means.

Now, assuming that irradiation time of the vacuum ultraviolet rays from the vacuum ultraviolet rays generator 102 corresponds to film-forming time, upon performing reaction at a reaction pressure of 100 mTorr inside the reactor 106, a protective film was formed to a thickness 5000 Å on the substrate 116 in 5 minutes of the film-forming time.

Figure 4:
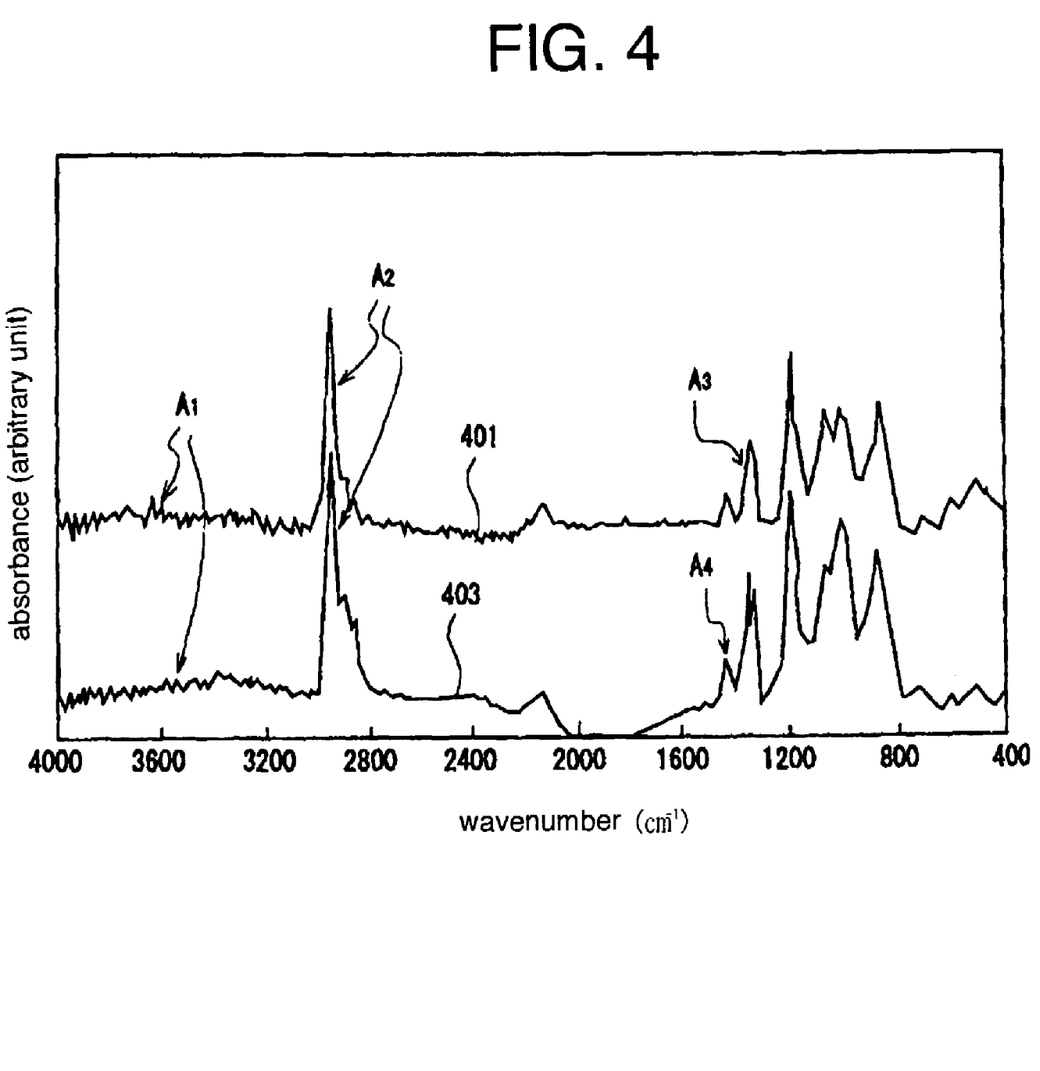
FIG. 4 is a view showing absorbance spectra of protective films fabricated by the embodiments of the invention, respectively.

Using the substrate 116 with the protective film formed thereon as a sample, a structure of the protective film formed on the substrate 116 was examined with a Fourier transform infrared spectrometer (hereinafter referred to as FT-IR) (in this case, use was made of IR-EPOCH (trade name) manufactured by Newly Instruments Co., Ltd.). In FIG. 4, there is shown a first spectrum 401 obtained as a result of measurement with the FT-IR, entering wavenumber (cm$^{-1}$) along the horizontal axis, and absorbance (arbitrary unit) along the vertical axis. The first spectrum 401 has three distinctive absorption characteristics comprising an absorption characteristic $A_1$ showing broad absorption between wavenumbers 3200 cm$^{-1}$ and 4000 cm$^{-1}$, an absorption characteristic $A_2$ showing sharp absorption in the vicinity of a point between wavenumbers 2800 cm$^{-1}$ and 3200 cm$^{-1}$ and an absorption characteristic $A_3$ represented by one of two peaks as seen between wavenumbers 1200 cm$^{-1}$ and 1600 cm$^{-1}$, positioned on the side of wavenumber 1600 cm$^{-1}$. The absorption characteristic $A_1$ shows that Si—NH bond exists in the protective film, the absorption characteristic $A_2$ shows absorption based on a methyl group ($CH_3$) existing in the protective film, and further, the absorption characteristic $A_3$ shows that Si—C bond exists in the protective film. Hence, it is presumed from the first spectrum 401 shown in FIG. 4 that the protective film formed on the substrate 116 has moisture-proof performance by virtue of the Si—NH bond. Furthermore, the protective film having the methyl group ($CH_3$) can be expected of having the function of a super water repellent film.

Subsequently, a pressure cooker test (PCT) was conducted on the protective film of the above-described composition for 100 hours on condition of temperature at 130?C, moisture at 85%, and pressure at $2.5×10^5$ Pa in accordance with the procedure specified by JIS Standard No. JIS-Z-8115 to examine the moisture-proof performance of the protective film. Further, a PCT was conducted on a sample, prepared by forming a TMS (tetramethylsilane) ($Si(CH_3)_4$) film on a BPSG film formed on the substrate 116 beforehand, serving as a comparative sample, on the same condition as described above and by the same procedure as described above.

If a film deposited on top of a BPSG film formed on the substrate 116 has low moisture-proof performance, phosphoric acid ($H_3PO_4$) and boric acid ($H_3BO_3$) are produced by the agency of water reaching the BPSG film after passing therethrough. As a result, aluminum (Al) wiring of the substrate 116 is corroded by the agency of phosphoric acid ($H_3PO_4$) and boric acid ($H_3BO_3$). With reference to the substrate 116 having the protective film (referred to hereinafter as a first sample) and the substrate 116 having the TMS film (referred to hereinafter as a second sample), respectively, the corrosion condition of the aluminum (Al) wiring of the substrate 116 was examined with a metallurgical microscope VANOX AHMT3 (trade name) manufactured by Olympus Optics Industries Co. Ltd. after completion of the PCTs to evaluate the moisture-proof performance of the protective film of the first sample by comparing the first sample with the second sample.

Figure 2A:
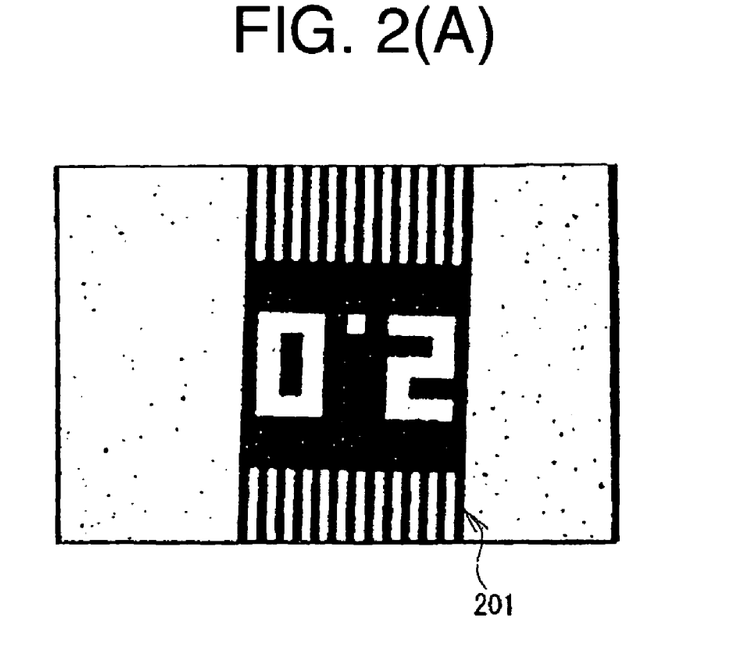
Figure 2B:
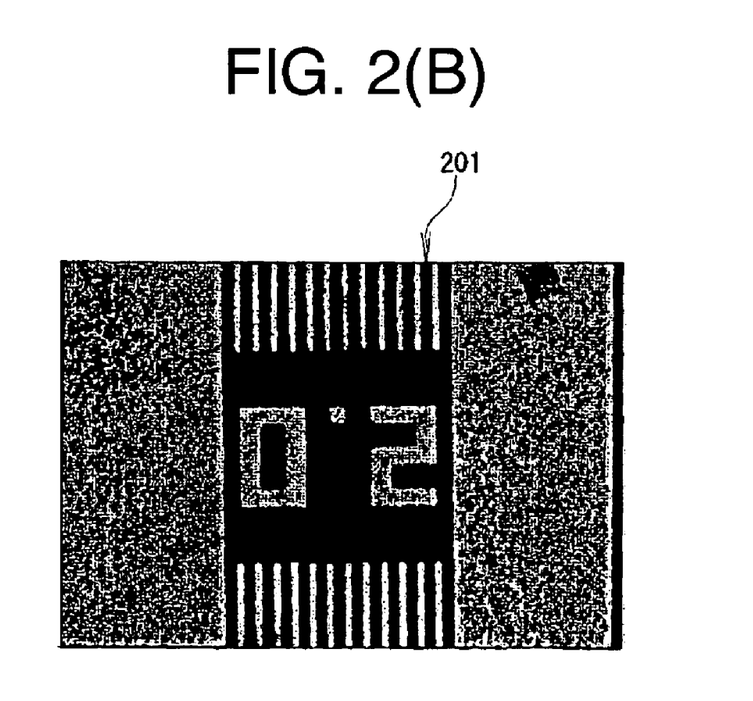

FIG. 2 (A) shows results of measuring the first sample with the metallurgical microscope prior to a PCT, and FIG. 2 (B) shows results of measuring the first sample with the metallurgical microscope after the PCT, respectively. FIG. 2 (A) and FIG. 2 (B) are views of the results of measuring an identical spot of the first sample with the metallurgical microscope, respectively, showing the results of measuring an aluminum (Al) wiring pattern 201 among a plurality of aluminum (Al) wiring patterns formed on the first sample from the top surface thereof, respectively.

Figure 3A:
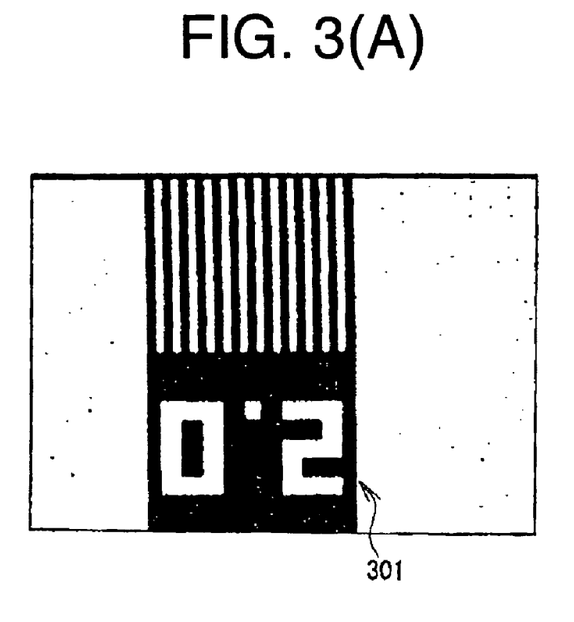
Figure 3B:
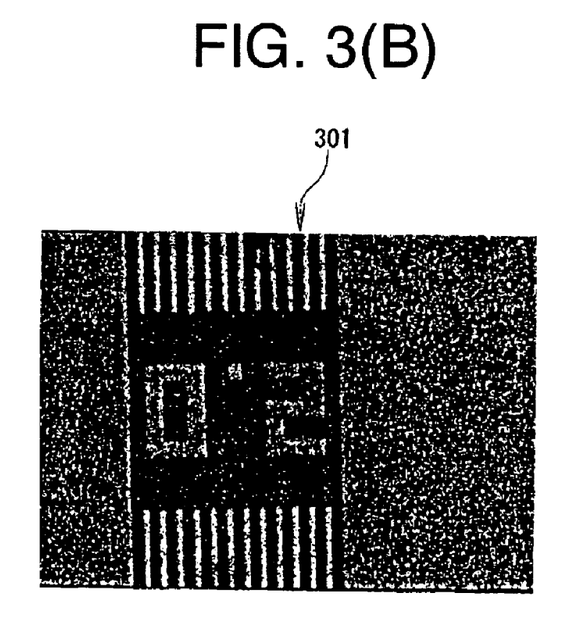

Further, FIG. 3 (A) shows results of measuring the second sample with the metallurgical microscope prior to a PCT, and FIG. 3 (B) shows results of measuring the second sample with the metallurgical microscope after the PCT, respectively. FIG. 3 (A) and FIG. 3 (B) are views of the results of measuring a spot of the second sample with the metallurgical microscope, corresponding to the spot of the first sample, measured with the metallurgical microscope, as shown in FIG. 2 (A) and FIG. 2 (B), respectively. As with FIG. 2 (A) and FIG. 2 (B), FIG. 3 (A) and FIG. 3 (B) show the results of measuring an aluminum (Al) wiring pattern 301 among a plurality of aluminum (Al) wiring patterns formed on the second sample from the top surface thereof, respectively.

As shown in FIG. 2 (A) or FIG. 3 (A), the aluminum (Al) wiring pattern 201 or 301, denoted by a number in white, and having black and white stripes, is formed on the substrate 116 of the first sample or the second sample prior to the PCT. Upon comparing the condition of the aluminum (Al) wiring pattern 201 with that of the aluminum (Al) wiring pattern 301 after the PCT, using the aluminum (Al) wiring pattern 201 shown in FIG. 2 (B) and the aluminum (Al) wiring pattern 301 shown in FIG. 3 (B), respectively, it is found out that white portions of the aluminum (Al) wiring pattern 301 of the second sample have undergone considerable discoloration, turning into a blackish color. The degree of such discoloration indicates the degree of corrosion of the aluminum (Al) wiring pattern caused by the agency of phosphoric acid ($H_3PO_4$) and boric acid ($H_3BO_3$) as previously described. Hence, it is evident from FIG. 2 (B) and FIG. 3 (B) that in contrast with the aluminum (Al) wiring pattern 201 of the first sample that is found hardly corroded after the PCT, the aluminum (Al) wiring pattern 301 of the second sample has undergone corrosion. That is, the protective film of the first sample proves excellent in moisture-proof performance.

As described hereinbefore, with the first embodiment, by carrying out a reaction in the vacuum ultraviolet radiation CVD system 100 at a reaction temperature as low as room temperature (25?C), the protective film excellent in moisture-proof performance can be formed without causing damage to a semiconductor device due to charged particles in plasma or a high reaction temperature as previously described.

In this connection, the temperature of the substrate 116, that is, a reaction temperature inside the reactor 106, is not limited to room temperature (25?C). In a reference literature (JP, H 13-274156, A), there is described relationship between a reaction temperature in a vacuum ultraviolet radiation CVD system and a film-forming rate, examined by the inventor et al of this application (refer to paragraph 11 of the reference literature). According to the description given in the reference literature, the higher the reaction temperature, the lower the film-forming rate becomes. Taking this point into consideration, it is presumed that the reaction temperature inside the reactor 106 can be set in a temperature range below between room temperature (25?C) and 10?C. This is because it is considered that a reaction rate of the reaction inside the vacuum ultraviolet radiation CVD system 100 described above will not be significantly affected in the temperature range.

Further, with the first embodiment, the reactor 106 is provided with an exhauster 120 comprising predetermined exhausting means, and the reactor 106 is exhausted by the exhauster 120.

Next, a second embodiment of a method of fabricating a protective film according to the invention is described hereinafter. With the second embodiment of the invention, a stock gas with an additive gas or a regulator gas, added thereto, is fed into the vacuum ultraviolet radiation CVD system 100 of the first embodiment, described with reference to FIG. 1, where a reaction is performed. Accordingly, duplicated description of the construction of the vacuum ultraviolet radiation CVD system 100 of the first embodiment, already described with reference to FIG. 1, is omitted.

As an example of the method of fabricating the protective film according to the second embodiment, there is described a case where the same BTBAS as that in the first embodiment is used for a stock gas. With the method of fabricating the protective film, to be described hereinafter, the stock gas, the construction of a substrate 116, respective constituent parts of a vacuum ultraviolet radiation CVD system 100 are assumed to be the same as those for the method of fabricating the protective film, using BTBAS as the stock gas, described in the first embodiment, omitting therefore duplicated description of the stock gas, the construction of the substrate 116, the respective constituent parts of the vacuum ultraviolet radiation CVD system 100, identical to those for the first embodiment.

With the second embodiment, BTBAS that is the stock gas, with an additive gas or a regulator gas, added thereto, is fed through a gas feeder 112 into a reactor 106 evacuated to a substantially vacuum state beforehand. Herein, the additive gas according to the second embodiment is a gas for increasing nitrogen (N) content in the protective film, formed on top of the substrate 116, by a reaction inside the reactor 106, and, for example, ammonia (NH3), and so forth are used for the additive gas. The regulator gas is a gas to be added to the stock gas and to be fed into the reactor 106, for use in regulating a partial pressure of the stock gas in the reactor 106, acceleration of the reaction, and so forth. A desirable gas of one species or a plurality of species, suitable for the purpose thereof, selected from the group consisting of rare gas, nitrogen (N2) gas, and so forth, is preferably used for the regulator gas.

With the second embodiment described hereinafter, BTBAS in vapor form of a vapor pressure 70 mTorr at 25?C is used as with the case of the first embodiment, and the BTBAS with ammonia ($NH_3$) as the additive gas, added thereto at a flow rate of $3.38 \times 10^{-2}$ Pa (m$^3$/s), is fed from a gas feeder 112 to the reactor 106. Further, as with the case of the first embodiment, there may be a case where the stock gas vaporized by use of means such as a vaporizer etc. with the additive gas added thereto is fed.

Vacuum ultraviolet rays radiated from a vacuum ultraviolet rays generator 102 comprising xenon (Xe) excimer lamps 108 have a main wavelength at 172 nm, and photon energy of 7.2 eV as previously described. A theoretical value of the bond energy of N—H bonds existing in ammonia ($NH_3$) is 4.0 eV. With the BTBAS and ammonia (NH3) being fed to the reactor 106 of the vacuum ultraviolet radiation CVD system 100, the vacuum ultraviolet rays are radiated from the vacuum ultraviolet rays generator 102. It is presumed that due to radiation of the vacuum ultraviolet rays, the BTBAS undergoes decomposition as already described, and besides, the N—H bonds of ammonia ($NH_3$) as the additive gas also undergoes decomposition. As a result, it is further presumed that, due the reaction taking place inside the reactor 106 as described in the first embodiment, N (nitrogen) content in the protective film to be formed will increase.

As already described, the temperature of a window 104 is kept at 90?C with heaters 110. Further, irradiance and a distance d between the window 104 and the substrate 116 are set on the same condition as that for the first embodiment. Furthermore, the temperature of the substrate 116 is adjusted by the same method as that for the first embodiment so as to maintain the temperature of the substrate 116 at room temperature (25?C).

With the second embodiment, assuming that irradiation time with the vacuum ultraviolet rays from the vacuum ultraviolet rays generator 102 corresponds to film-forming time, upon causing a reaction to proceed at a reaction pressure of 200 mTorr inside the reactor 106, a protective film was formed to a thickness 5000 Å on the substrate 116 in 5 minutes of the film-forming time.

As with the first embodiment, using the substrate 116 with the protective film formed thereon as a sample, the structure of the protective film formed on the substrate 116 was examined with a Fourier transform infrared spectrometer (hereinafter referred to as FT-IR) (in this case, use was made of IR-EPOCK (trade name) manufactured by Newly Instruments Co., Ltd.). In FIG. 4, there is shown a second spectrum 403 obtained as a result of measurement with the FT-IR, along with the first spectrum 401, in the same manner as that for the first spectrum 401. The second spectrum 403 has three distinctive absorption characteristics comprising an absorption characteristic $A_1$ and an absorption characteristic $A_2$, similar to those of the first spectrum 401, and an absorption characteristic $A_4$ represented by one of two peaks as seen between wavenumbers 1200 cm$^{-1}$ and 1600 cm$^{-1}$, positioned on the side of wavenumber 1600 cm$^{-1}$. The absorption characteristic $A_1$ and absorption characteristic $A_2$ indicate presence of Si—NH bonds and a methyl group ($CH_3$) in the protective film, respectively. And further, the absorption characteristic $A_4$ indicates presence of an amino group (—$NH_2$) in the protective film. As shown in FIG. 4, the second spectrum 403 has substantially same absorption characteristics as those of the first spectrum 401, and hence, it is presumed that the protective film formed according the first embodiment is the same in composition as the protective film formed according the second embodiment. It follows therefore that the protective film formed on the substrate 116 according to the second embodiment has moisture-proof performance on the basis of the Si—NH bonds and can also be expected of having the function of a super water repellent film on the basis of the methyl group ($CH_3$).

Subsequently, a PCT was conducted on the protective film of the above-described composition for 100 hours on the same condition as that for the first embodiment in accordance with the same procedure as was adopted for the first embodiment to examine the moisture-proof performance of the protective film. Further, a sample used as a comparative sample is the same kind of sample as the second sample described in the first embodiment, and the moisture-proof performance of the protective film as described above was evaluated by the same procedure as was adopted for the first embodiment. As a result, it has been confirmed that the protective film of the second embodiment, formed by the procedure as described above, is excellent in moisture-proof performance.

Accordingly, with the second embodiment of the method of fabricating the protective film according to the invention, the same advantageous effects as obtained for the first embodiment can be obtained. Further, it is presumed that, in view of the point described in the first embodiment, a reaction temperature inside the reactor 106 for the second embodiment can be set in the same temperature range as that for the first embodiment.

With the second embodiment described in the foregoing, a case where the additive gas is added to the stock gas is described, however, there may be a case where a regulator gas as well as the additive gas are added to the stock gas.

Variations

With the invention, not only a protective film but also an ONO laminated film (a laminated film made of two silicon oxide films ($SiO_2$ films) with a silicon nitride film (SiN film) sandwiched therebetween), a spacer, and so forth can be fabricated by adjusting the stock gas, reaction condition, and so forth.

Further, with the invention, if siloxane gas having Si—O bonds is used for the stock gas, and a gas such as oxygen ($O_2$) or dinitrogen monoxide ($N_2O$) etc. is used for the additive gas, an insulating film made of an oxide film can be fabricated.

Thus, with the variations of the invention as described above, a nitride film, an insulating film, and so forth can be formed at a low temperature without causing damage to a semiconductor device due to charged particles in plasma as with the case of the first and second embodiments.

Application Patterns

The application of the invention is not limited to the fabrication of the protective film for a semiconductor integrated circuit, but the invention is also applicable to the fabrication of a protective film for a display panel, and so forth, to which a high temperature process is not applicable. An example of such application patterns is described hereinafter.

A liquid crystal display (LCD (Liquid Crystal Display)) and an organic electroluminescent (EL) device, in common use, comprise sealing substrates made of a glass substrate, and so forth. Accordingly, a panel made up by use of the LCD or the organic EL device cannot be bent. Further, the thermally stable temperature of the organic electroluminescent (EL) device in common use is 80?C.

Therefore, if a sealing film having moisture-proof performance, fabricated according to the invention, is used for the sealing substrates, it becomes possible to provide a LCD and an organic EL device that are reduced in weight and thickness. Further, it becomes possible to bend a panel made up by use of the LCD or organic EL device as described. That is, the invention can be applied to the fabrication of the so-called flexible display panel.

The method of fabricating the protective film according to the invention has an advantageous effect in that the protective film can be formed at a low reaction temperature by the vacuum ultraviolet radiation CVD method without causing damage as already described to a semiconductor device due to the charged particles in plasma or a high reaction temperature.

What is claimed is:

1. A method of fabricating a protective film comprising:
    providing a vacuum ultraviolet radiation CVD (Chemical Vapor Deposition) system comprising a vacuum ultraviolet rays generator, a reactor provided with a platform for supporting a substrate, a heat retainer provided on the platform, and a window separating the vacuum ultraviolet rays generator from the reactor;
    feeding an organic stock gas from a gas feeder into the reactor while retaining temperature of the substrate at a temperature about equal to or less than 100° C. with the heat retainer; and
    irradiating simultaneously the reactor with vacuum ultraviolet rays from the vacuum ultraviolet rays generator through the window;
    wherein photons from the vacuum ultraviolet ray generator have a wavelength of about 172 nm and an energy of about 7.2 eV, sufficient to break an Si—N bond; and
    wherein an organosilazane gas having Si-N bonds is used for the organic stock gas.

2. A method of fabricating a protective film according to claim 1, wherein retaining of the temperature with the heat retainer is carried out such that the temperature of the substrate is kept at a low temperature in a range of about 25° C. to 100° C.

3. The method of fabricating a protective film according to claim 1, further comprising adding an additive gas for increasing nitrogen content in the protective film, or a regulator gas for use in regulating a partial pressure of the organic stock gas in the reactor to the organic stock gas so as to be fed from the gas feeder into the reactor.

4. The method of fabricating a protective film according to claim 1, wherein the step of providing the ultraviolet rays generator includes providing a xenon excimer lamp.

* * * * *